United States Patent
Yokoyama et al.

(10) Patent No.: US 11,894,291 B2
(45) Date of Patent: Feb. 6, 2024

(54) MANUFACTURING METHOD OF SEMICONDUCTOR DEVICE AND SEMICONDUCTOR DEVICE

(71) Applicant: Mitsubishi Electric Corporation, Tokyo (JP)

(72) Inventors: Shuhei Yokoyama, Tokyo (JP); Shogo Shibata, Tokyo (JP); Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 331 days.

(21) Appl. No.: 17/182,419

(22) Filed: Feb. 23, 2021

(65) Prior Publication Data
US 2021/0375728 A1   Dec. 2, 2021

(30) Foreign Application Priority Data
Jun. 2, 2020   (JP) ................ 2020-095910

(51) Int. Cl.
*H01L 23/495* (2006.01)
*H01L 23/00* (2006.01)
*H01L 23/31* (2006.01)
*H01L 21/48* (2006.01)
*H01L 21/56* (2006.01)

(52) U.S. Cl.
CPC .... *H01L 23/49555* (2013.01); *H01L 21/4825* (2013.01); *H01L 21/4842* (2013.01);
(Continued)

(58) Field of Classification Search
CPC .......... H01L 23/49555; H01L 23/3107; H01L 23/4952; H01L 23/49537; H01L 23/49575;
(Continued)

(56) References Cited

U.S. PATENT DOCUMENTS

| | | | |
|---|---|---|---|
| 2004/0145043 A1 | 7/2004 | Hayashi et al. | |
| 2014/0145193 A1 | 5/2014 | Kadoguchi et al. | |

(Continued)

FOREIGN PATENT DOCUMENTS

| | | |
|---|---|---|
| DE | 11 2012 002 724 T5 | 3/2014 |
| DE | 10 2014 116 175 A1 | 5/2015 |
| JP | H01-100456 U | 7/1989 |
| JP | H10-189859 A | 7/1998 |
| JP | 2004-063688 A | 2/2004 |
| JP | 2015-090960 A | 5/2015 |

(Continued)

OTHER PUBLICATIONS

An Office Action; "Notice of Reasons for Refusal," mailed by the Japanese Patent Office dated May 9, 2023, which corresponds to Japanese Patent Application No. 2020-095910 and is related to U.S. Appl. No. 17/182,419; with English language translation.

(Continued)

*Primary Examiner* — Marc Anthony Armand
(74) *Attorney, Agent, or Firm* — Studebaker & Brackett PC

(57) ABSTRACT

A manufacturing method of a semiconductor device according to the technology disclosed in the present specification includes: providing at least one semiconductor element; connecting, to the semiconductor element, a plurality of first terminals and at least one second terminal that is a control terminal to which a voltage lower than that of the first terminal is applied; and forming a first bent part in the first terminal, in which the first bent part does not protrude on the surfaces, facing each other, of the plurality of first terminals that are adjacent to each other.

20 Claims, 16 Drawing Sheets

(52) U.S. Cl.
CPC ........ *H01L 21/565* (2013.01); *H01L 23/3107* (2013.01); *H01L 23/4952* (2013.01); *H01L 23/49537* (2013.01); *H01L 23/49575* (2013.01); *H01L 24/85* (2013.01); *H01L 2224/8592* (2013.01); *H01L 2924/1203* (2013.01); *H01L 2924/14* (2013.01)

(58) Field of Classification Search
CPC ............. H01L 21/4825; H01L 21/4842; H01L 21/565
See application file for complete search history.

(56) References Cited

U.S. PATENT DOCUMENTS

| | | | |
|---|---|---|---|
| 2016/0307829 A1 | 10/2016 | Kadoguchi et al. | |
| 2019/0198431 A1* | 6/2019 | Zhang | H01L 23/36 |
| 2019/0214749 A1* | 7/2019 | Chang | H01L 23/49579 |
| 2019/0221549 A1* | 7/2019 | Hayashi | H01L 24/48 |

FOREIGN PATENT DOCUMENTS

| | | |
|---|---|---|
| JP | 2019-075525 A | 5/2019 |
| KR | 10-1698431 B1 | 2/2017 |

OTHER PUBLICATIONS

An Office Action mailed by the German Patent and Trade Mark Office dated Oct. 25, 2023, which corresponds to German Patent Application No. DE 10 2021 110 270.7.

\* cited by examiner

F I G. 1 7
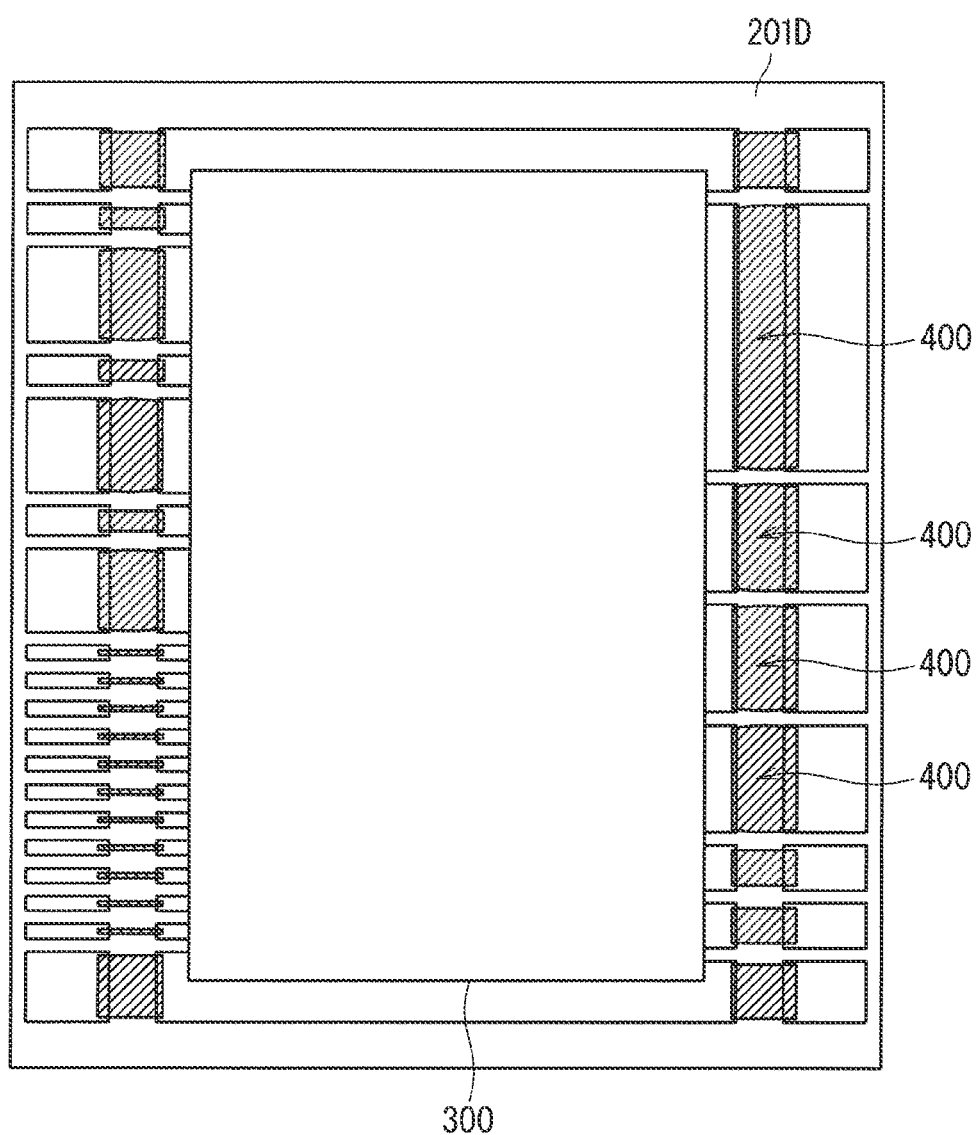

MANUFACTURING METHOD OF SEMICONDUCTOR DEVICE AND SEMICONDUCTOR DEVICE

BACKGROUND OF THE INVENTION

Field of the Invention

The technology disclosed in the present specification relates to a manufacturing method of a semiconductor device and a semiconductor device.

Description of the Background Art

In the semiconductor device disclosed in, for example, Japanese Patent Application Laid-Open No. H10-189859 (1998), a plurality of lead terminals connected to a semiconductor element are drawn to the outside and arranged apart from each other.

When a semiconductor device is used especially in a high-power application, it is necessary to increase the distance (terminal pitch) between lead terminals in order to ensure a spatial distance and a creepage distance. On the other hand, in the process of processing the lead terminal, the bent place (bent part) of the lead terminal may bulge such that the distance between the lead terminals is decreased.

If the terminal pitch is increased in consideration of the above, there is the problem that the semiconductor device becomes extra large.

SUMMARY

The technology disclosed in the present specification is a technology for suppressing an increase in size of a semiconductor device while ensuring the spatial distance and creepage distance between terminals.

A first aspect of the technology disclosed in the present specification relates to a manufacturing method of a semiconductor device. The method includes: providing at least one semiconductor element; connecting, to the semiconductor element, a plurality of first terminals and at least one second terminal that is a control terminal to which a voltage lower than that of the first terminal is applied; and forming a first bent part in the first terminal, in which on surfaces, facing each other, of the plurality of first terminals that are adjacent to each other, the first bent part does not protrude.

A second aspect of the technology disclosed in the present specification relates to a semiconductor device. The semiconductor device includes at least one semiconductor element and a plurality of terminals connected to the semiconductor element, in which: the plurality of terminals includes a plurality of first terminals each having a first bent part and at least one second terminal that is a control terminal to which a voltage lower than that of the first terminal is applied; and on surfaces, facing each other, of the plurality of first terminals that are adjacent to each other, the first bent part does not protrude.

According to the first and second aspects of the technology disclosed in the present specification, the spatial distance and creepage distance between lead terminals are not decreased by preventing the bent part from protruding on the surfaces, facing each other, of the terminals to which a high voltage is applied. Therefore, the size of the semiconductor device can be reduced.

The objectives, features, aspects, and advantages associated with the technology disclosed in the present specification will become more apparent from the detailed description and accompanying drawings presented below.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 17 is a plan view showing an example of the structure of the semiconductor device, according to a preferred embodiment, at the time when steps from the power chip die bonding step to the transfer molding step have been completed;

DESCRIPTION OF THE PREFERRED EMBODIMENTS

Figure 1:
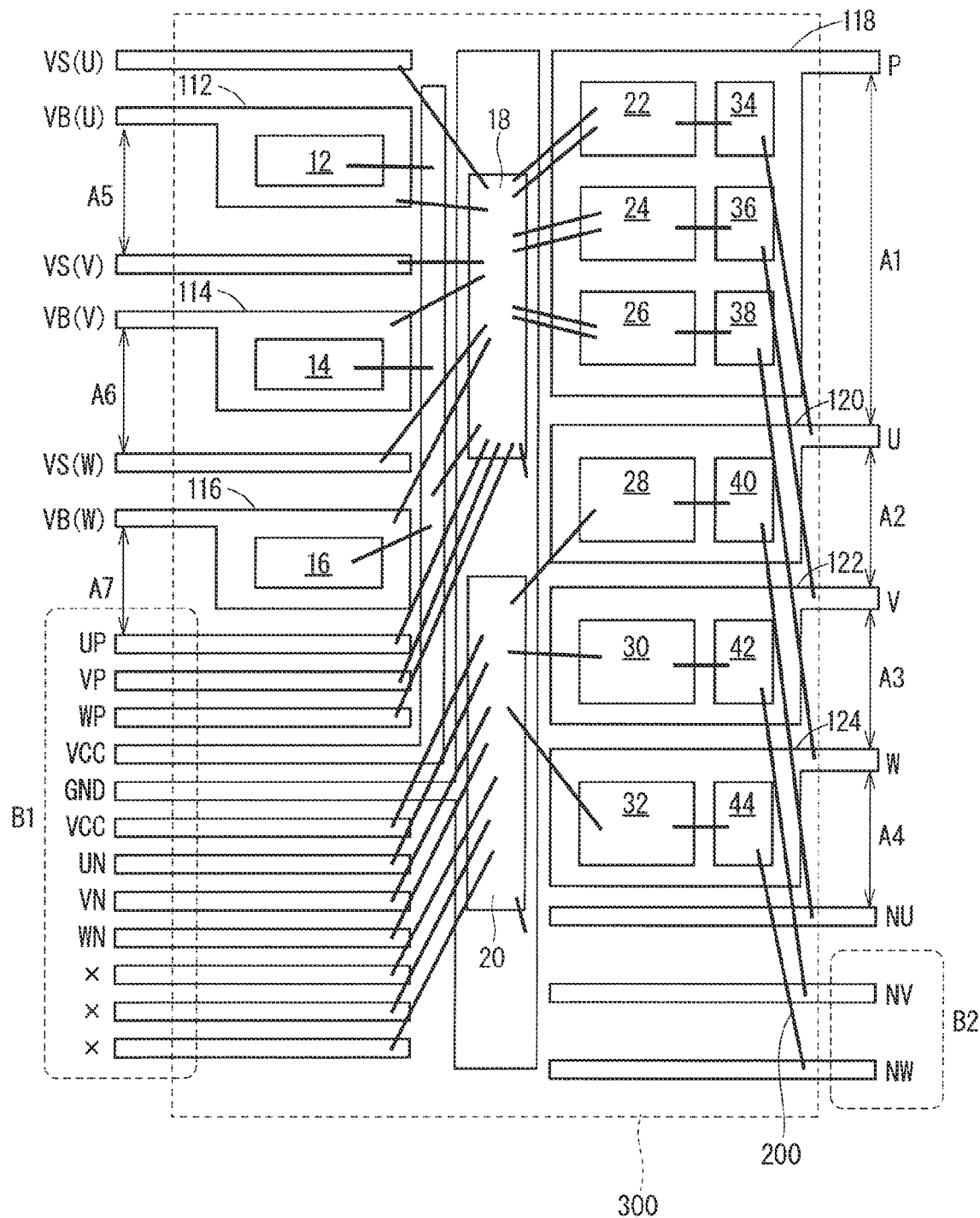
FIG. 1 is a plan view schematically showing an example of a configuration of a semiconductor device according to a preferred embodiment.

Hereinafter, preferred embodiments will be described with reference to the accompanying drawings. In the following preferred embodiments, detailed features and the like are also shown for the purpose of explaining the technology, but they are illustrative, and not all of them are necessarily essential features in order for the preferred embodiments to be feasible.

It should be noted that the drawings are shown schematically, and for convenience of explanation, the configurations are omitted or simplified in the drawings as appropriate. In addition, the mutual relationships between the sizes and positions of the configurations and the like each shown in different drawings are not necessarily depicted accurately, and may be changed as appropriate. In addition, in drawings such as plan views, not cross-sectional views, hatching may also be added in order to facilitate understanding of the contents of the preferred embodiments.

In addition, in the following description, the same constituents are designated by the same reference numerals, and their names and functions are set to be the same. Therefore, detailed description thereof may be omitted to avoid duplication.

In addition, when it is described in the following description that a certain constituent is "provided", "included", or "held," it is not an exclusive expression that excludes the existence of other constituents, unless otherwise specified.

In addition, even if ordinal numbers such as "first" or "second" are used in the following description, these terms are used for convenience in order to facilitate understanding of the contents of the preferred embodiments. The contents of the preferred embodiments are not limited to the orders and the like that can be generated by these ordinal numbers.

In addition, expressions, in the following description, that indicate equality, such as, for example, "same", "equal", "uniform", or "homogeneous", include, unless otherwise specified, the case where it is indicated that there is a strictly equal state and the case where there is a difference in a range in which a tolerance or similar function can be obtained.

In addition, even if terms meaning specific positions or directions, such as "above", "below", "left", "right", "side", "bottom", "front", or "back", are used in the following description, these terms are used for convenience in order to facilitate understanding of the contents of the preferred embodiments. The above positions or directions have nothing to do with those when the preferred embodiments are actually carried out.

First Preferred Embodiment

Hereinafter, a manufacturing method of a semiconductor device and the semiconductor device, according to the present preferred embodiment, will be described.

<Configuration of Semiconductor Devices>

The (power) semiconductor device shown as an example shown in the following preferred embodiment includes, on a lead frame, a power chip (e.g., switching element), a diode element, and an integrated circuit (IC), which is a semiconductor device for a high-power application sealed by transfer molding. Terminals are arranged along two opposite sides of the four sides, and control-side terminals and power-side terminals are separated along each side. The power chip may be not only a semiconductor chip using Si but also a semiconductor chip using a wide-bandgap semiconductor such as SiC.

Figure 2:
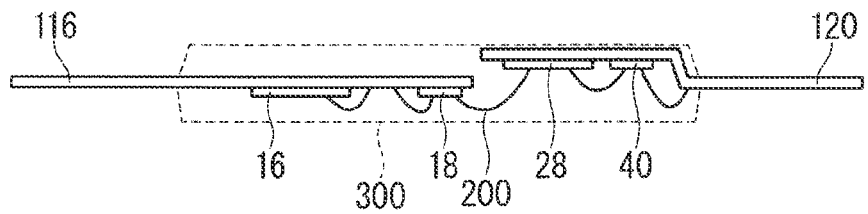
FIG. 2 is a cross-sectional view schematically showing the example of the configuration of the semiconductor device according to the preferred embodiment.

FIG. 1 is a plan view schematically showing an example of the configuration of the semiconductor device according to the present preferred embodiment. FIG. 2 is a cross-sectional view schematically showing the example of the configuration of the semiconductor device according to the present preferred embodiment.

As an example is shown in FIGS. 1 and 2, the semiconductor device includes a bootstrap diode 12, a bootstrap diode 14, a bootstrap diode 16, a high-voltage IC 18, a low-voltage IC 20, a power chip 22, a power chip 24, a power chip 26, a power chip 28, a power chip 30, a power chip 32, a freewheel diode 34, a freewheel diode 36, a freewheel diode 38, a freewheel diode 40, a freewheel diode 42, a freewheel diode 44, a lead frame 112, a lead frame 114, a lead frame 116, a lead frame 118, a lead frame 120, a lead frame 122, a lead frame 124, wires 200 for connecting between the respective elements, and a mold resin 300 for sealing these configurations.

The bootstrap diode 12 is connected to the lead frame 112, and further connected to the high-voltage IC 18 as a semiconductor element via the lead frame 112.

Similarly, the bootstrap diode 14 is connected to the lead frame 114, and further connected to the high-voltage IC 18 via the lead frame 114.

Similarly, the bootstrap diode 16 is connected to the lead frame 116, and further connected to the high-voltage IC 18 via the lead frame 116.

The power chip 22 is connected to the lead frame 118, and further connected to the freewheel diode 34 and the high-voltage IC 18 via the wires 200, respectively.

Similarly, the power chip 24 is connected to the lead frame 118, and further connected to the freewheel diode 36 and the high-voltage IC 18 via the wires 200, respectively.

Similarly, the power chip 26 is connected to the lead frame 118, and further connected to the freewheel diode 38 and the high-voltage IC 18 via the wires 200, respectively.

The power chip 28 is connected to the lead frame 120, and further connected to the freewheel diode 40 and the low-voltage IC 20 as a semiconductor element via the wires 200, respectively.

Similarly, the power chip 30 is connected to the lead frame 122, and further connected to the freewheel diode 42 and the low-voltage IC 20 via the wires 200, respectively.

Similarly, the power chip 32 is connected to the lead frame 124, and further connected to the freewheel diode 44 and the low-voltage IC 20 via the wires 200, respectively.

To the high-voltage IC 18, three-phase (U, V, W) positive power supply terminals VB (lead frame 112, lead frame 114, and lead frame 116) and three-phase (U, V, W) floating power supply terminals VS are connected via wires.

A P-phase output terminal on the P side of the lead frame 118, a U-phase output terminal on the P side of the lead frame 120, a V-phase output terminal on the P side of the lead frame 122, a W-phase output terminal on the P side of the lead frame 124, and the above three-phase (U, V, W) floating power supply terminals VS are terminals to which a high voltage is applied. Therefore, spatial distances and creepage distances that are certain distances or more are required between them.

Here, wide-bandgap semiconductors may be used for the switching elements and the diode elements. Here, the wide-bandgap semiconductor generally refers to a semiconductor having a forbidden bandwidth of about 2 eV or more, and as the examples thereof, group III nitrides such as gallium nitride (GaN), group II oxides such as zinc oxide (ZnO), group II chalcogenides such as zinc selenide (ZnSe), diamond, silicon carbide, and the like are known.

A distance A1 in FIG. 1 indicates the distance between the P-phase output terminal on the P side and the U-phase output terminal on the P side. Similarly, a distance A2 in FIG. 1 indicates the distance between the U-phase output terminal on the P side and the V-phase output terminal on the P side. Similarly, a distance A3 in FIG. 1 indicates the distance between the V-phase output terminal on the P side and the W-phase output terminal on the P side. Similarly, a distance A4 in FIG. 1 indicates the distance between the W-phase output terminal on the P side and a U-phase output terminal on the N side. Similarly, a distance A5 in FIG. 1 indicates the distance between the U-phase positive power supply terminal VB and the V-phase floating power supply terminal VS. Similarly, a distance A6 in FIG. 1 indicates the distance between the V-phase positive power supply terminal VB and the W-phase floating power supply terminal VS. Similarly, a distance A7 in FIG. 1 indicates the distance between the W-phase positive power supply terminal VB and a UP terminal.

On the other hand, a high voltage is not applied to the UP terminal, a VP terminal, a WP terminal, a VCC terminal, a UN terminal, a VN terminal, a WN terminal, and X terminals, which are control terminals arranged in a B1 area. Therefore, spatial distances and creepage distances that are certain distances or more are not required between these terminals. The X terminal in FIG. 1 is a terminal to be used for protection function and the like.

Similarly, a high voltage is not applied to an NV terminal and an NW terminal, which are control terminals arranged in a B2 area. Therefore, spatial distances and creepage distances that are certain distances or more are not required between these terminals.

Figure 3:
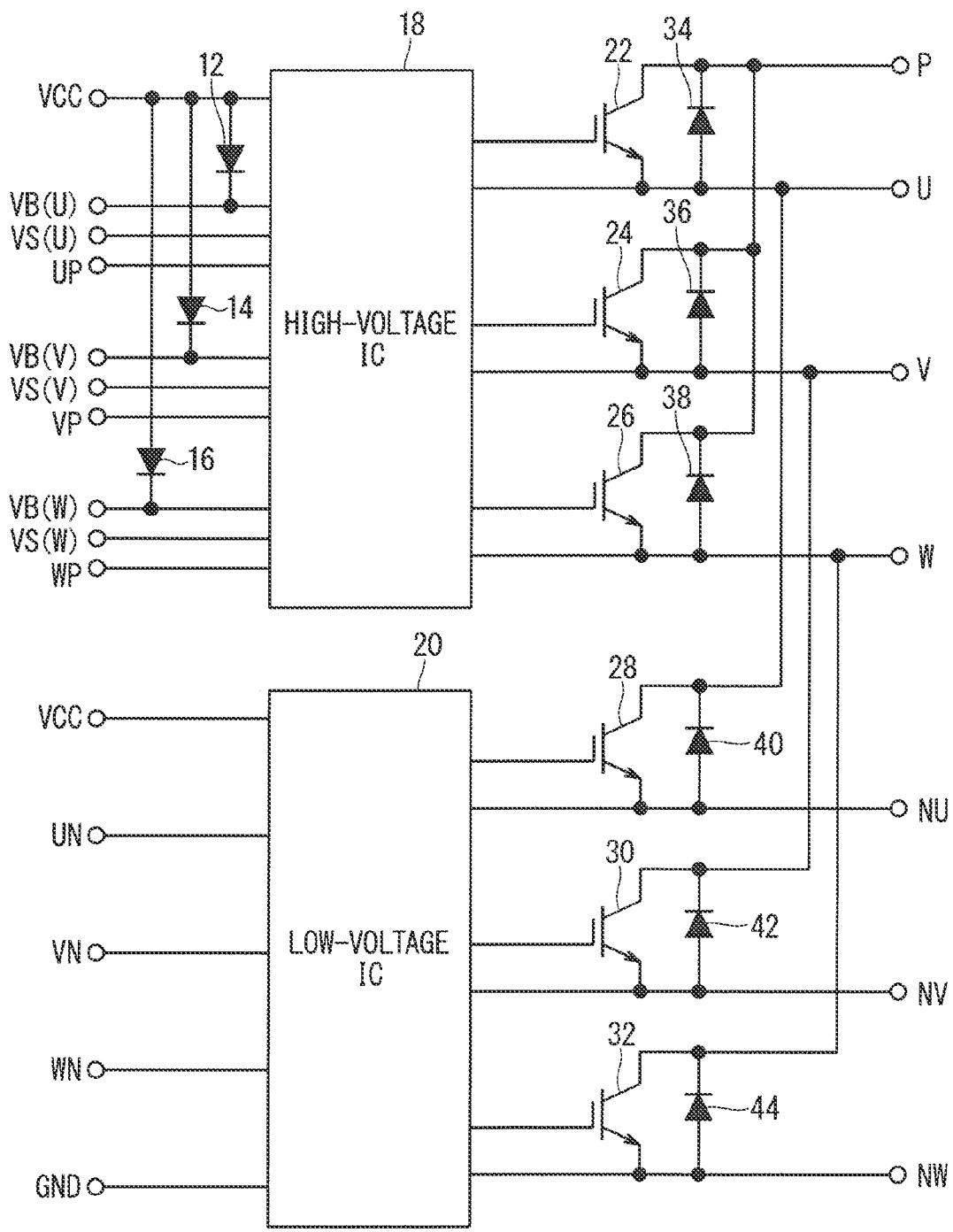
FIG. 3 is a circuit diagram corresponding to the configuration whose example is shown in FIGS. 1 and 2.

FIG. 3 is a circuit diagram corresponding to the configuration whose example is shown in FIGS. 1 and 2. As an example is shown in FIG. 3, the semiconductor device includes a bootstrap diode 12, a bootstrap diode 14, a bootstrap diode 16, the high-voltage IC 18, the low-voltage IC 20, a power chip 22, a power chip 24, a power chip 26, a power chip 28, a power chip 30, a power chip 32, a freewheel diode 34, a freewheel diode 36, a freewheel diode 38, a freewheel diode 40, a freewheel diode 42, and a freewheel diode 44.

Figure 4:
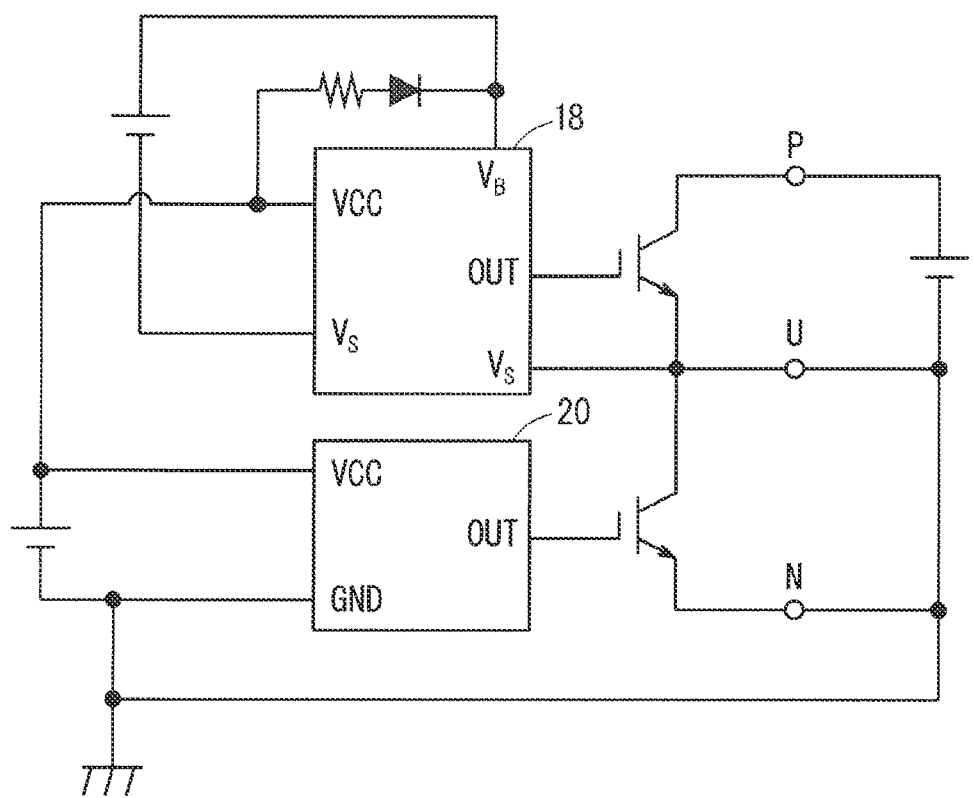
FIG. 4 is a circuit diagram mainly related to, of the configuration shown in FIG. 3, a high-voltage IC and a low-voltage IC.

FIG. 4 is a circuit diagram mainly related to, of the configuration shown in FIG. 3, the high-voltage IC 18 and the low-voltage IC 20. As an example is shown in FIG. 4, the high-voltage IC 18 and the low-voltage IC 20 are connected to the common VCC voltage, and a bootstrap diode is connected between the VCC terminal and the VB terminal of the high-voltage IC 18.

<Manufacturing Method of Semiconductor Device>

Figure 5:
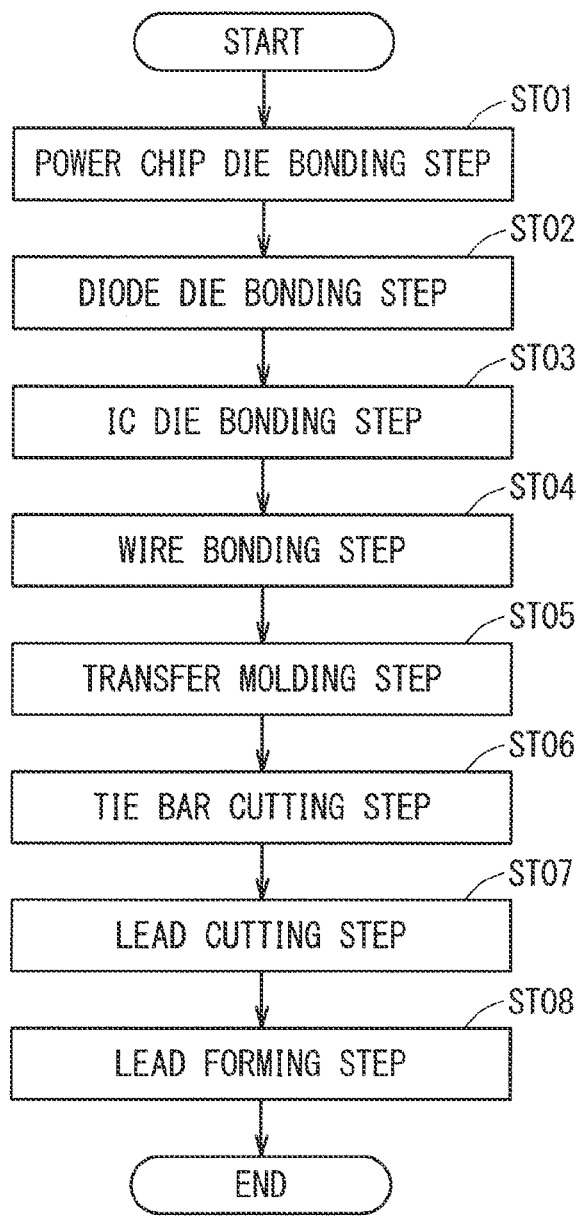
FIG. 5 is a flowchart showing manufacturing steps of a semiconductor device according to a preferred embodiment, especially an example of manufacturing steps related to lead forming.

FIG. 5 is a flowchart showing manufacturing steps of the semiconductor device according to the present preferred embodiment, especially an example of manufacturing steps related to lead forming. As an example is shown in FIG. 5, in the manufacturing steps of the semiconductor device according to the present preferred embodiment, the power chip 22, the power chip 24, the power chip 26, the power chip 28, the power chip 30, and the power chip 32 are first bonded to corresponding places of the lead frames, respectively, in a power chip die bonding step (step ST01 in FIG. 5).

Next, the bootstrap diode 12, the bootstrap diode 14, the bootstrap diode 16, the freewheel diode 34, the freewheel diode 36, the freewheel diode 38, and the freewheel diode 40, the freewheel diode 42, and the freewheel diode 44 are respectively bonded to corresponding places of the lead frames in a diode die bonding step (step ST02 in FIG. 5).

Next, the high-voltage IC 18 and the low-voltage IC 20 are respectively bonded to corresponding places of the lead frames in an IC die bonding step (step ST03 in FIG. 5).

Next, wire bonding is performed using the wires 200 on each power chip, each diode, and each IC, which are bonded to the corresponding places of the lead frames, in a wire bonding step (step ST04 in FIG. 5).

Next, the above configuration in a state where the wire bonding has been performed is partially sealed with the mold resin 300 in a transfer molding step (step ST05 in FIG. 5).

Next, a tie bar part connecting between the lead terminals is cut in a tie bar cutting step (step ST06 in FIG. 5). Next, an unnecessary portion of the lead terminal is appropriately cut in a lead cutting step (step ST07 in FIG. 5). Then, appropriate processing such as bending the lead terminal is performed in a lead forming step (step ST08 in FIG. 5).

Figure 6:
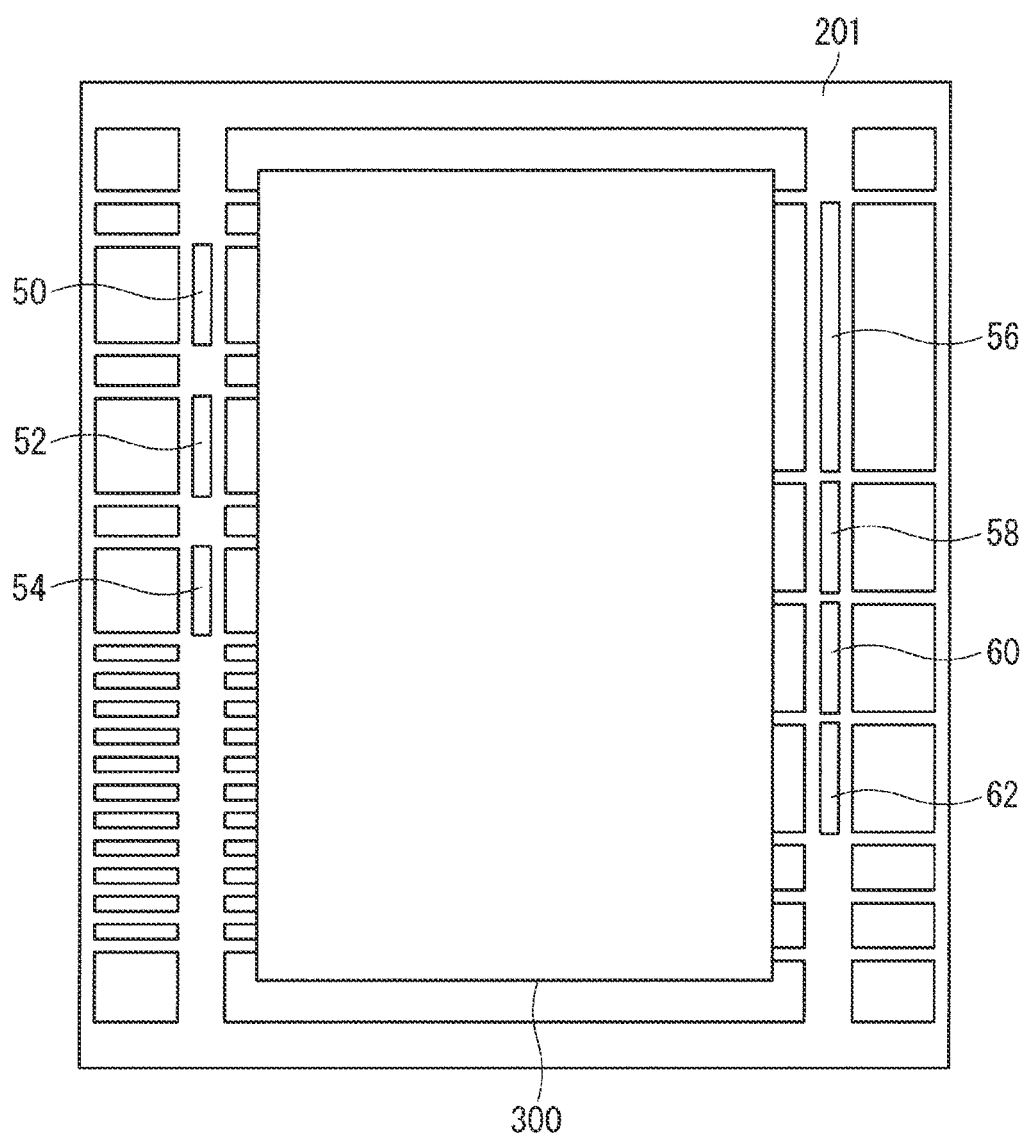
FIG. 6 is a plan view showing an example of the structure of the semiconductor device at the time when steps from a power chip die bonding step to a transfer molding step in FIG. 5 have been completed.

FIG. 6 is a plan view showing an example of the structure of the semiconductor device at the time when steps from the power chip die bonding step to the transfer molding step in FIG. 5 have been completed.

For the distances A1 to A7 each requiring a spatial distance and a creepage distance that are certain distances or more, a slit 50, a slit 52, a slit 54, a slit 56, a slit 58, a slit 60, and a slit 62 are provided respectively in the tie bar part corresponding to an area between portions that become the terminals of a lead 201 in the state of being connected to the semiconductor element. Specifically, the slit 56 is provided in a place where the distance A1 is set, the slit 58 is provided in a place where the distance A2 is set, the slit 60 is provided in a place where the distance A3 is set, the slit 62 is provided in a place where the distance A4 is set, the slit 50 is provided in a place where the distance A5 is set, the slit 52 is provided in a place where the distance A6 is set, and the slit 54 is provided in a place where the distance A7 is set.

On the other hand, the above slits are not provided between portions that become terminals arranged in the B1 area and the B2 area, to which a high voltage is not applied and between which a spatial distance and a creepage distance that are certain distances or more are not required.

Figure 7:
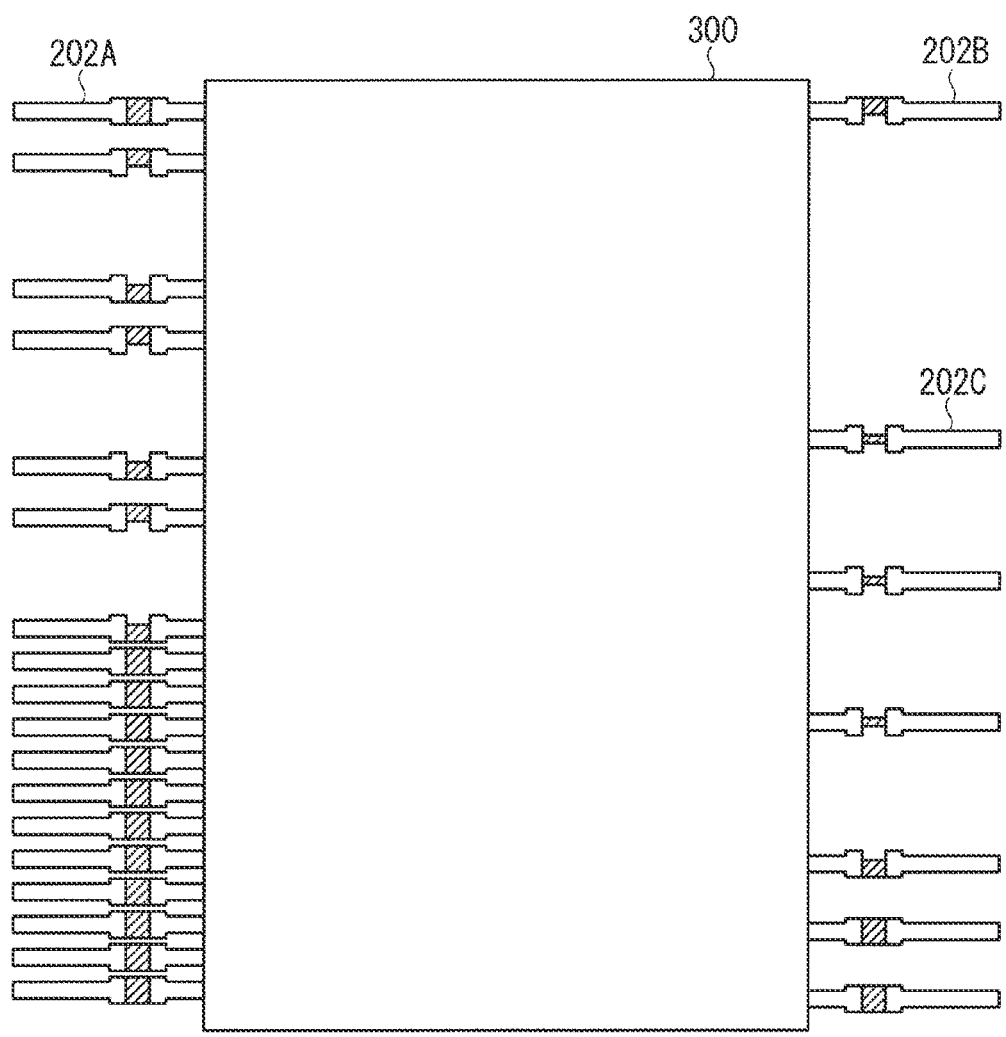
FIG. 7 is a plan view showing an example of the structure of the semiconductor device at the time when, after the transfer molding step in FIG. 5, a tie bar cutting step and up to a lead cutting step have been completed.

FIG. 7 is a plan view showing an example of the structure of the semiconductor device at the time when, after the transfer molding step in FIG. 5, the tie bar cutting step and up to the lead cutting step have been completed.

As an example is shown in FIG. 7, a lead terminal 202A, a lead terminal 202B, and a lead terminal 202C, which are connected to the respective lead frames, respectively extend from the mold resin 300.

The lead terminals, in FIG. 7, that extend to the right from the mold resin 300 correspond, in order from the top, to the P-phase output terminal on the P side of the lead frame 118 in FIG. 1, the U-phase output terminal on the P side of the lead frame 120, the V-phase output terminal on the P side of the lead frame 122, the W-phase output terminal on the P side of the lead frame 124, an NU terminal, the NV terminal, and the NW terminal.

The lead terminals, in FIG. 7, that extend to the left from the mold resin 300 correspond, in order from the top, to the floating power supply terminal VS(U) in FIG. 1, the positive power supply terminal VB(U) of the lead frame 112, the floating power supply terminal VS(V), the positive power supply terminal VB(V) of the lead frame 114, the floating power supply terminal VS(W), the positive power supply terminal VB(W) of the lead frame 116, the UP terminal, the VP terminal, the WP terminal, the VCC terminal, the UN terminal, the VN terminal, the WN terminal, and the three X terminals.

Here, the lead terminal 202A is a lead terminal in which no slit is formed on the side of the place where the terminal is formed. The lead terminal 202B is a lead terminal in which a slit is formed on one side of the place where the terminal is formed. The lead terminal 202C is a lead terminal in which slits are formed on both sides of the place where the terminal is formed.

In the lead terminal 202B and the lead terminal 202C, the thickness of each lead terminal is thin on the side where the slit is formed. That is, the slit at the corresponding position is formed to narrow the area where the lead terminal is formed.

Figure 8:
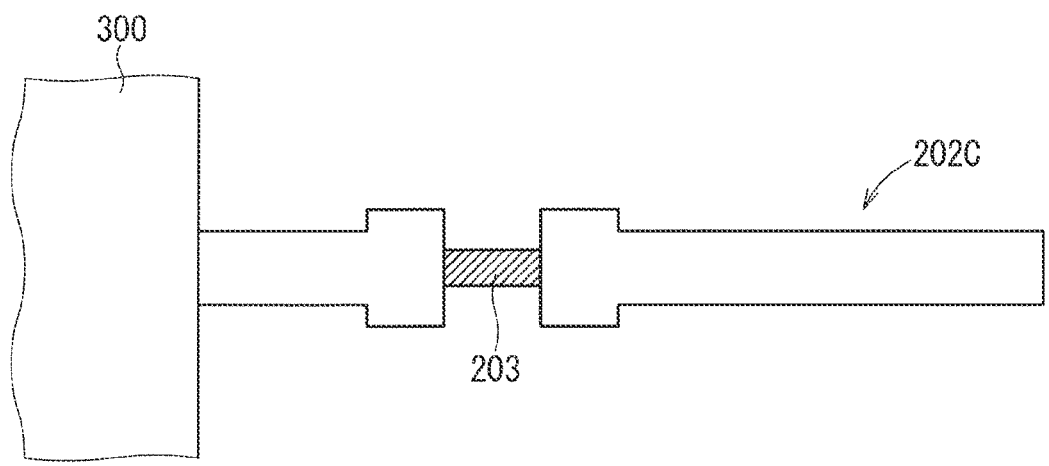
FIG. 8 is a view specifically showing an example of a configuration of a lead terminal whose example is shown in FIG. 7.

FIG. 8 is a view specifically showing an example of the configuration of the lead terminal 202C whose example is shown in FIG. 7. As an example is shown in FIG. 8, the lead terminal 202C includes a processed part 203 on which processing such as bending will be performed in a later step. The processed part 203 is formed to be thinner than the other portions of the lead terminal 202C in order to facilitate the processing. Since the thickness of the processed part 203 is smaller than the other portions, a bending position is stabilized when the lead terminal 202C is processed in the later lead forming step. Therefore, a dimensional variation in the lead terminal 202C can be suppressed.

On the other hand, the thickness of a portion, corresponding to the processed part 203 of the lead terminal 202C, of the lead terminal 202A whose example is shown in FIG. 7 is the same as the other portions of the lead terminal 202A. With such a configuration, the electrical stability of the lead frame is improved, and the processability in the steps up to the transfer molding step is also improved. Therefore, the rate of occurrence of defective products in the manufacturing steps can be reduced.

Figure 9:
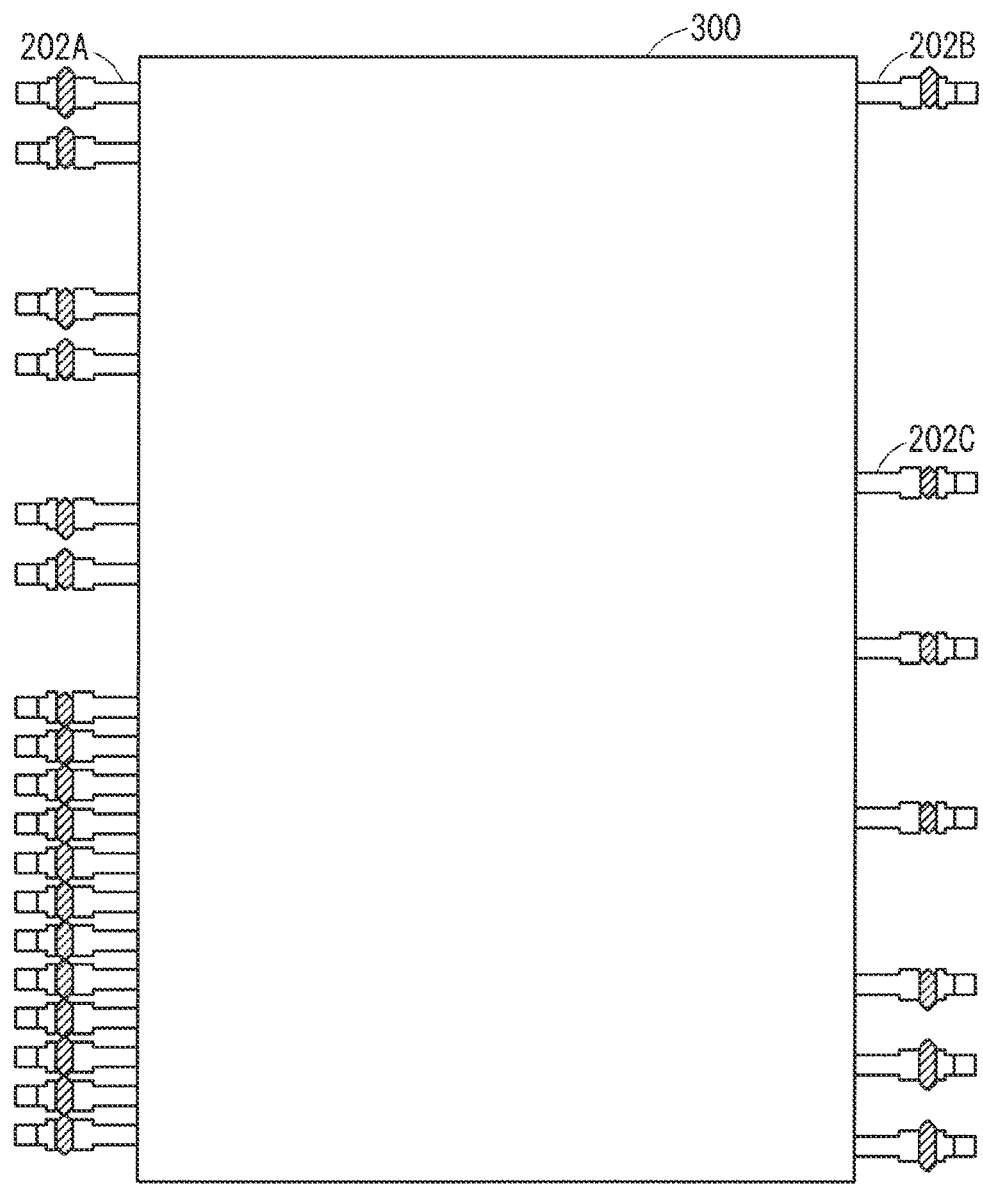
FIG. 9 is a plan view showing an example of the structure of the semiconductor device at the time when, after the lead cutting step in FIG. 5, up to a lead forming step has been completed.
Figure 10:
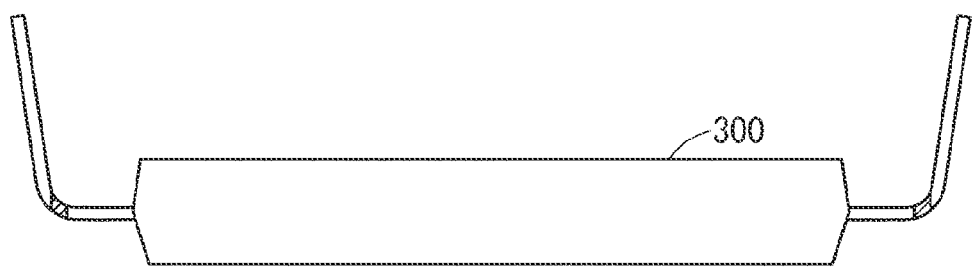
FIG. 10 is a cross-sectional view of the configuration whose example is shown in FIG. 9.

FIG. 9 is a plan view showing an example of the structure of the semiconductor device at the time when, after the lead cutting step in FIG. 5, up to the lead forming step has been completed. FIG. 10 is a cross-sectional view of the configuration whose example is shown in FIG. 9.

As an example is shown in. FIGS. 9 and 10, the lead terminal 202A, the lead terminal 202B, and the lead terminal 202C, which are connected to the respective lead frames, are bent toward the front of the paper surface of FIG. 9 (upward from the paper surface of FIG. 10) by lead forming.

Figure 11:
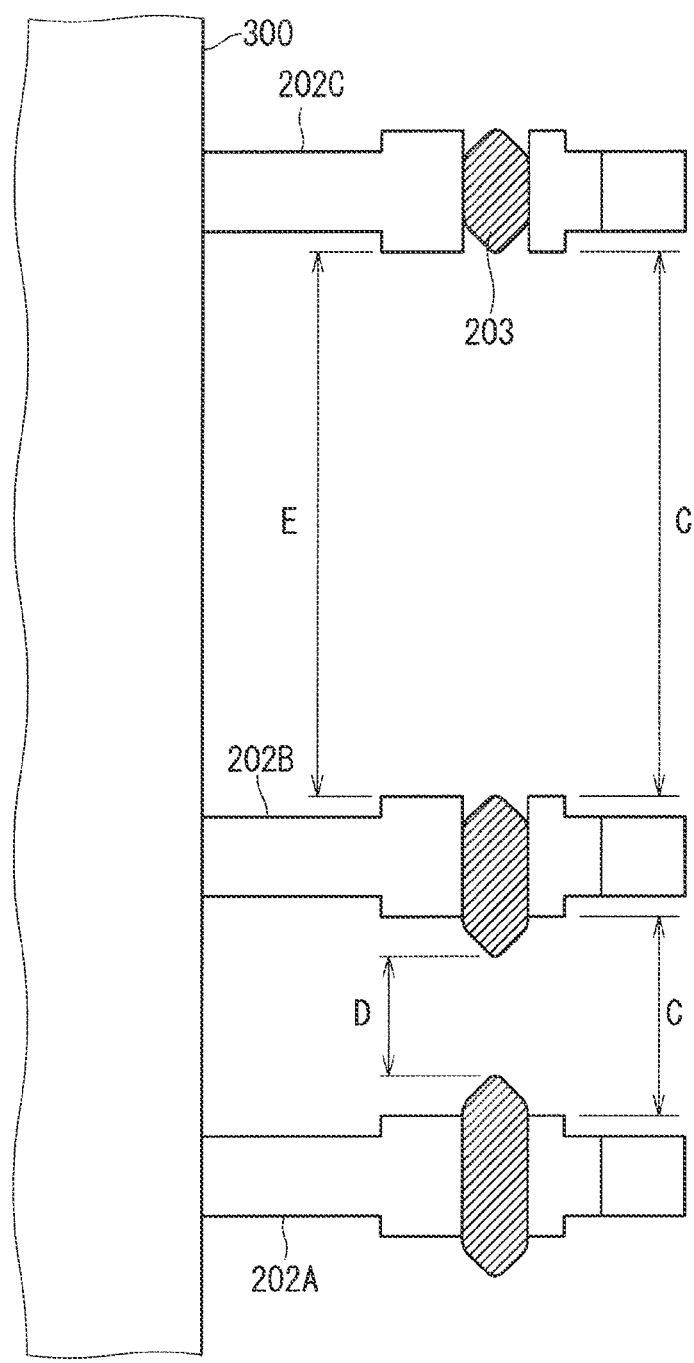
FIG. 11 is a view specifically showing examples of the configurations of the lead terminals whose examples are shown in FIGS. 9 and 10.

FIG. 11 is a view specifically showing an example of the configuration of the lead terminal 202C whose example is shown in FIGS. 9 and 10. As an example is shown in FIG. 11, the lead terminal 202C includes the processed part 203 formed to be thinner than the other portions. Therefore, even after the processed part 203 bulges when bent toward the front of the paper surface by the lead forming (after becoming a bent part), the portion (bent part) does not become thicker than the other portions of the lead terminal 202C.

On the other hand, the lead terminal 202A does not include the processed part 203, unlike the lead terminal 202C. Therefore, after bulging when bent toward the front of the paper surface by the lead forming, the bent portion (bent part) becomes thicker than the other portions of the lead terminal 202A.

In addition, the thickness of a portion, which has bulged when bent, of the lead terminal 202B does not become thicker on the side where the slit is formed, but on the side where the slit is not formed, the thickness of a portion, which has bulged when bent, of the lead terminal 202B still becomes larger.

According to the above, in a place, among the places between the lead terminals, where the slit is not formed (e.g., the place between the lead terminals 202A, etc.), a bent part, which is a portion where the lead terminal has bulged when bent, protrudes in a direction between the lead terminals. Therefore, the spatial distance and creepage distance between the lead terminals are decreased. In the example of FIG. 11, a distance D between the lead terminal 202A and the lead terminal 202B corresponds to the distance between the portions that have bulged when bent. The distance D becomes smaller than a distance C in the case where the thickness of each lead terminal does not change.

On the other hand, in a place, among the places between the lead terminals, where the slit is formed, a bent part, which is a portion where the lead terminal has bulged when bent, does not protrude in a direction between the lead terminals. Therefore, the spatial distance and creepage distance between the lead terminals are not decreased. In the example of FIG. 11, a distance E between the lead terminal 202B and the lead terminal 202C corresponds to the distance between the end faces of the terminals before being bent, which is equal to the distance C in the case where the thickness of each lead terminal does not change. The bent part of the lead terminal may be formed to be thinner than the other portions of the lead terminal.

As described above, by performing the tie bar cutting step and the lead cutting step in a state where a slit is formed between the lead terminals to which a high voltage is applied, the spatial distance and creepage distance between the lead terminals are not decreased in the place where the slit is formed, even after the lead forming step. Therefore, the size of the semiconductor device can be reduced. On the other hand, by performing the tie bar cutting step and the lead cutting step in a state where no slit is formed between the lead terminals to which a high voltage is not applied, the thickness of each lead terminal is maintained. Thereby, the electrical stability and mechanical strength of the lead frame can be improved.

Second Preferred Embodiment

A manufacturing method of a semiconductor device and the semiconductor device, according to the present preferred embodiment, will be described. In the following description, the same constituents as those described in the above preferred embodiment are designated by the same reference numerals and illustrated, and the detailed description thereof will be appropriately omitted.

<Manufacturing Method of Semiconductor Device>

Figure 12:
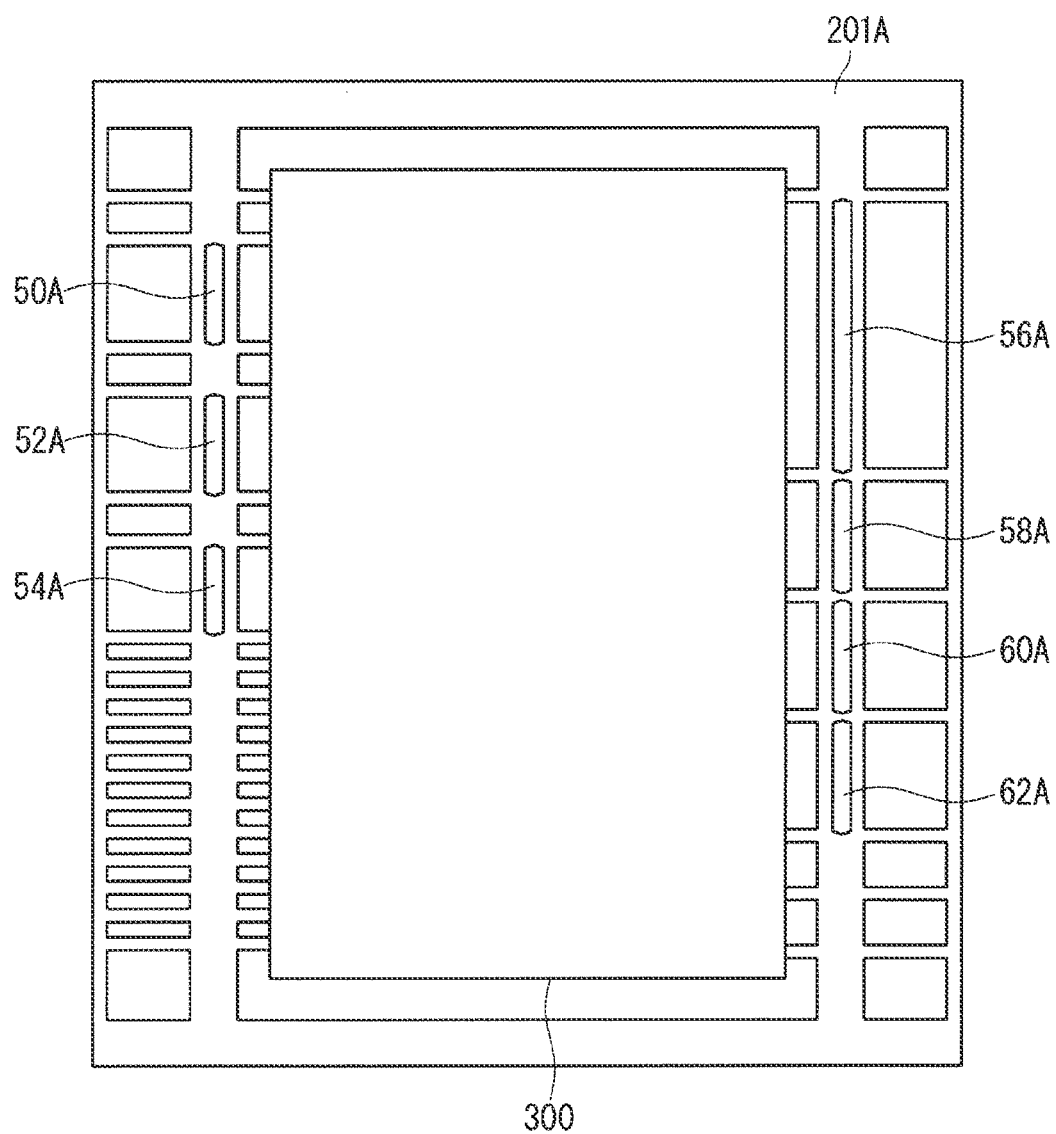
FIG. 12 is a plan view showing an example of the structure of the semiconductor device, according to a preferred embodiment, at the time when steps from the power chip die bonding step to the transfer molding step have been completed.

FIG. 12 is a plan view showing an example of the structure of the semiconductor device, according to the present preferred embodiment, at the time when steps from the power chip die bonding step to the transfer molding step have been completed.

For the distances A1 to A7 in FIG. 1 each requiring a spatial distance and a creepage distance that are certain distances or more, a slit 50A, a slit 52A, a slit 54A, a slit 56A, a slit 58A, a slit 60A, and a slit 62A are each provided in a tie bar part between portions that become the terminals of a lead 201A. Specifically, the slit 56A is provided in the place where the distance A1 is set, the slit 58A is provided in the place where the distance A2 is set, the slit 60A is provided in the place where the distance A3 is set, the slit 62A is provided in the place where the distance A4 is set, the slit 50A is provided in the place where the distance A5 is set, the slit 52A is provided in the place where the distance A6 is set, and the slit 54A is provided in the place where the distance A7 is set.

On the other hand, the above slits are not provided between portions that become the terminals arranged in the B1 area and the B2 area of FIG. 1, to which a high voltage is not applied and between which a spatial distance and a creepage distance that are certain distances or more are not required.

Figure 13:
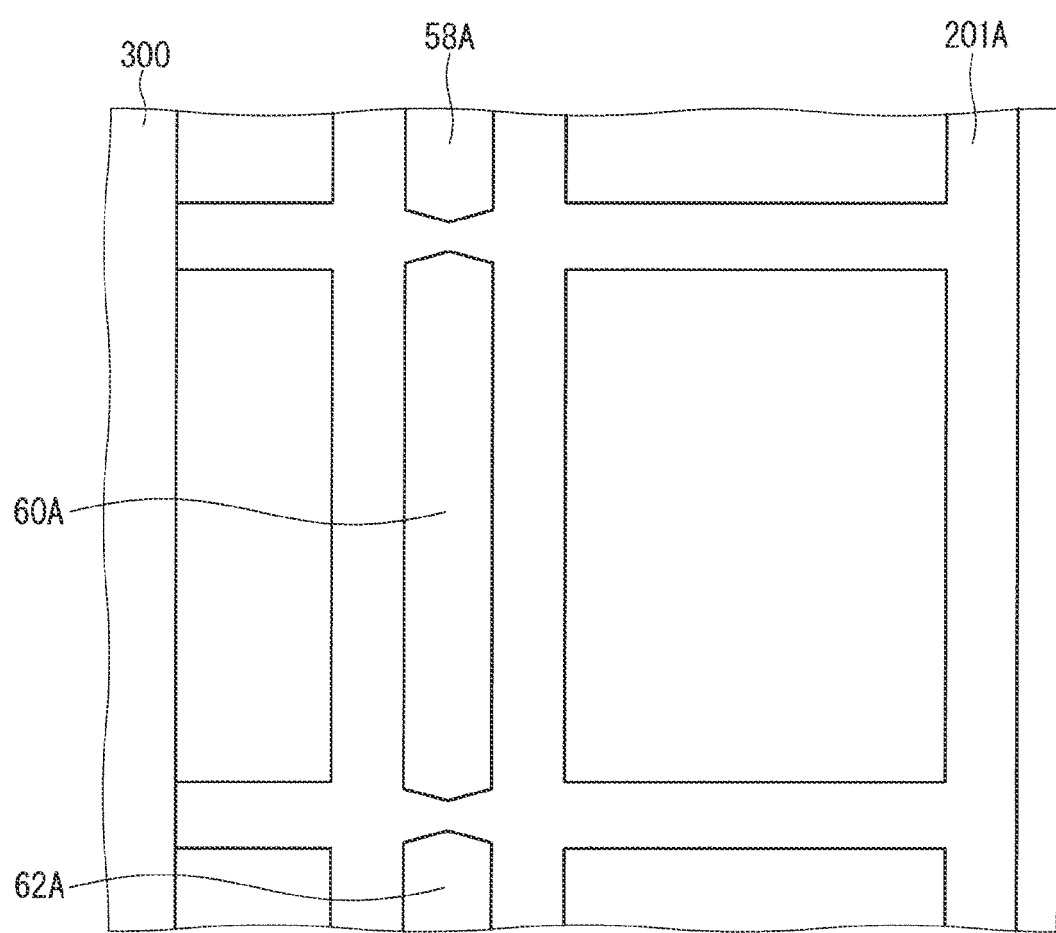
FIG. 13 is a plan view showing an example of the shape of a slit shown in FIG. 12.

FIG. 13 is a plan view showing an example of the shape of the slit 60A shown in FIG. 12. As an example is shown in FIG. 13, the slit 60A has a shape in which the surfaces facing the lead terminals have a convex shape (a shape having vertices in FIG. 13). The shapes of the other slits may be the same.

According to the configuration of the present preferred embodiment, the shapes of the surfaces, facing the lead terminals, of the slit have a convex shape, so that a bending position is stabilized when the lead terminal is processed in the later lead forming step. Therefore, a dimensional variation in the lead terminal can be suppressed.

Third Preferred Embodiment

A manufacturing method of a semiconductor device and the semiconductor device, according to the present preferred embodiment, will be described. In the following description, the same constituents as those described in the above preferred embodiment are designated by the same reference numerals and illustrated, and the detailed description thereof will be appropriately omitted.

<Manufacturing Method of Semiconductor Device>

Figure 14:
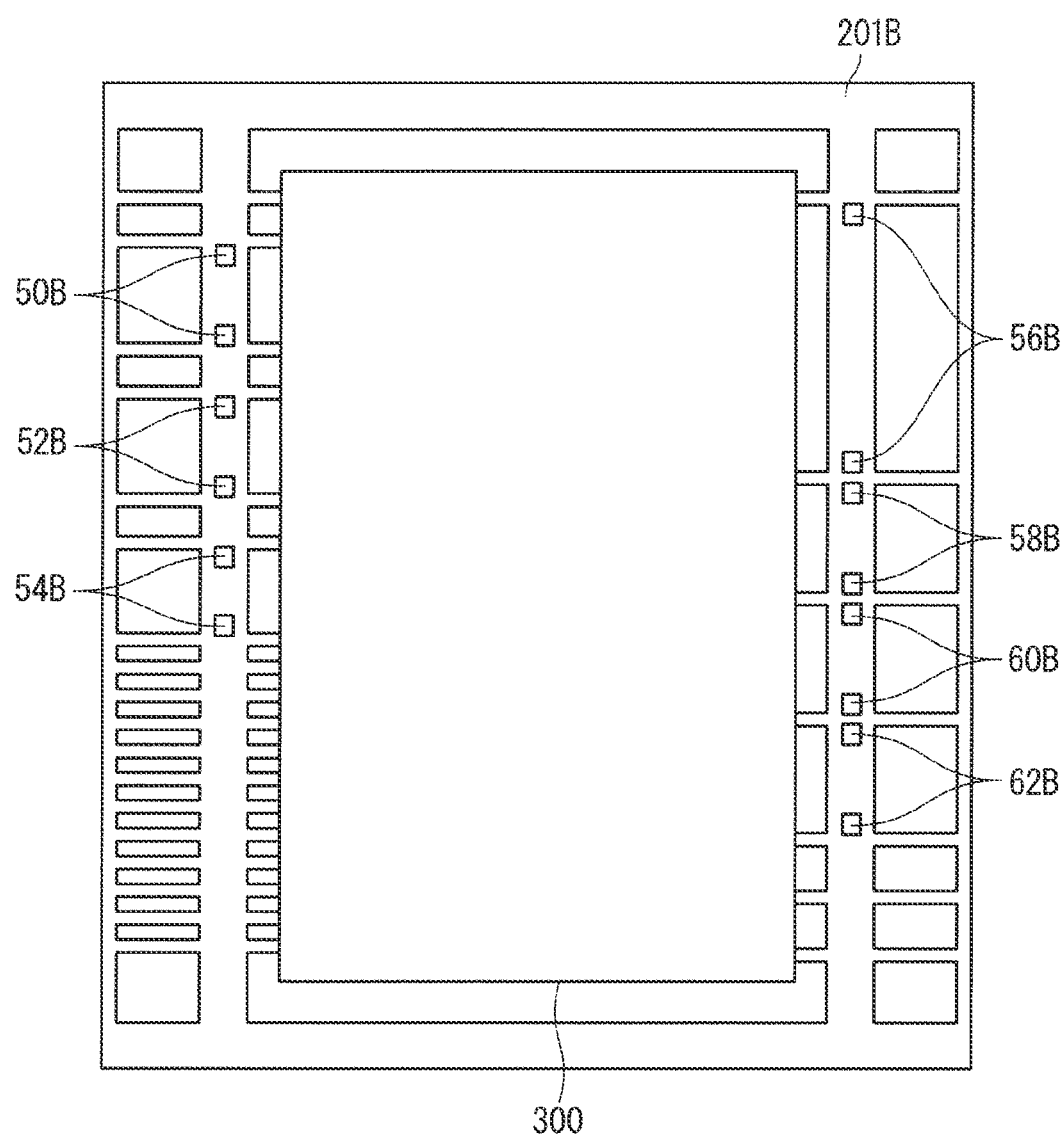
FIGS. 14 and 15 are each a plan view showing an example of the structure of the semiconductor device, according to a preferred embodiment, at the time when steps from the power chip die bonding step to the transfer molding step have been completed.

FIG. 14 is a plan view showing an example of the structure of the semiconductor device, according to the present preferred embodiment, at the time when steps from the power chip die bonding step to the transfer molding step have been completed.

For the distances A1 to A7 in FIG. 1 each requiring a spatial distance and a creepage distance that are certain distances or more, slits 50B, slits 52B, slits 54B, slits 56B, slits 58B, slits 60B, and slits 62B are each provided in a tie bar part between portions that become the terminals of a lead 201B. Specifically, the slits 56B are provided in the place where the distance A1 is set, the slits 58B are provided in the place where the distance A2 is set, the slits 60B are provided in the place where the distance A3 is set, the slits 62B are provided in the place where the distance A4 is set, the slits 50B are provided in the place where the distance A5 is set, the slits 52B are provided in the place where the distance A6 is set, and the slits 54B are provided in the place where the distance A7 is set.

The slits 50B, the slits 52B, the slits 54B, the slits 56B, the slits 58B, the slits 60B, and the slits 62B are each a pair of slits formed only in the vicinities of the lead terminals.

On the other hand, the above slits are not provided between portions that become the terminals arranged in the B1 area and the B2 area of FIG. 1, to which a high voltage is not applied and between which a spatial distance and a creepage distance that are certain distances or more are not required.

According to the configuration of the present preferred embodiment, a slit is formed only in the vicinity of the lead terminal, so that a bending position is stabilized when the lead terminal is processed in the later lead forming step. Therefore, a dimensional variation in the lead terminal can be suppressed. Further, the area where the slit is formed becomes narrow, so that the mechanical strength of the lead frame can be improved.

Fourth Preferred Embodiment

A manufacturing method of a semiconductor device and the semiconductor device, according to the present preferred embodiment, will be described. In the following description, the same constituents as those described in the above preferred embodiment are designated by the same reference numerals and illustrated, and the detailed description thereof will be appropriately omitted.

<Manufacturing Method of Semiconductor Device>

Figure 15:
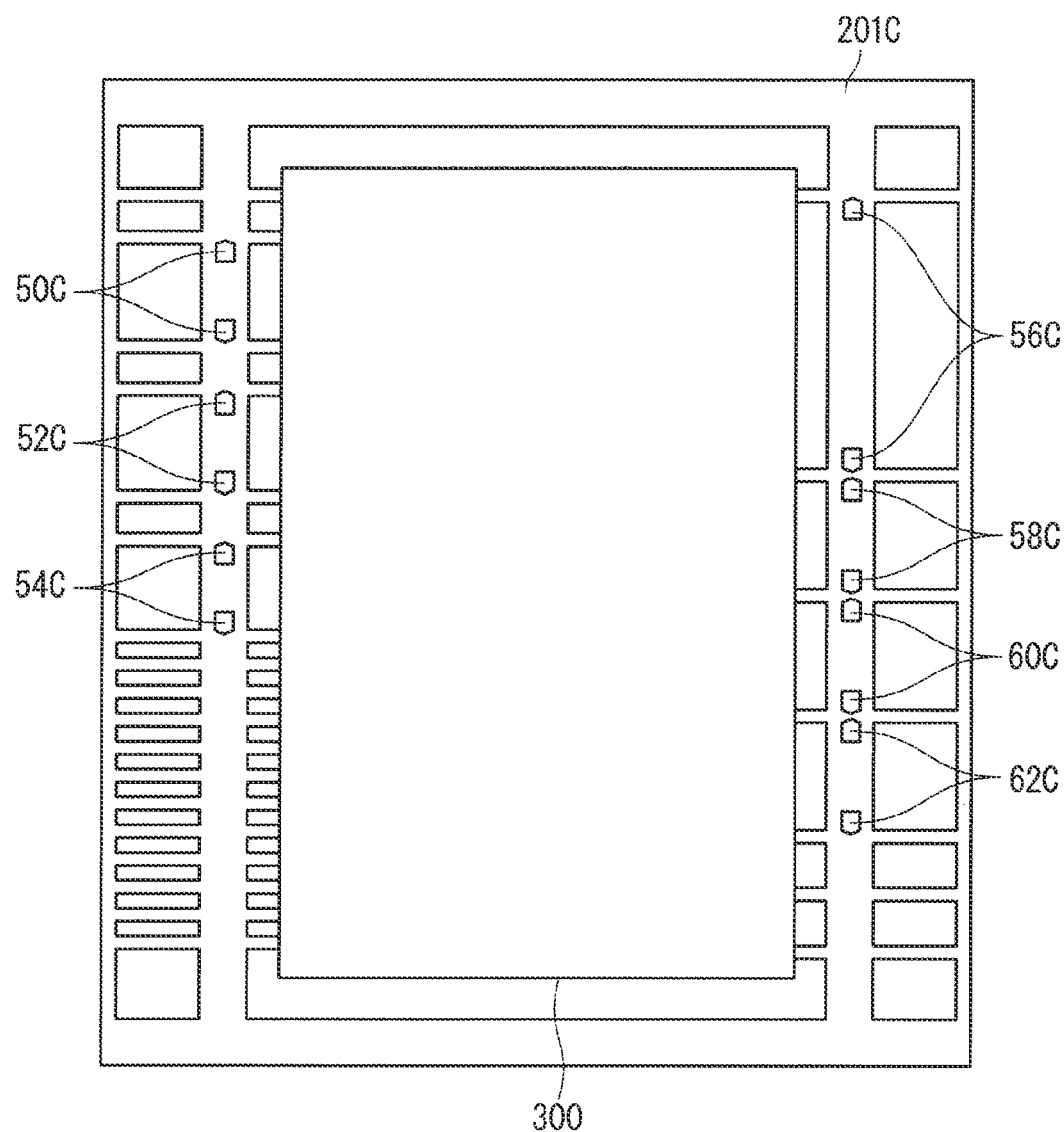

FIG. 15 is a plan view showing an example of the structure of the semiconductor device, according to the present preferred embodiment, at the time when steps from the power chip die bonding step to the transfer molding step have been completed.

For the distances A1 to A7 in FIG. 1 each requiring a spatial distance and a creepage distance that are certain distances or more, slits 50C, slits 52C, slits 54C, slits 56C, slits 58C, slits 60C, and slits 62C are each provided in a tie bar part between portions that become the terminals of a lead 201C. Specifically, the slits 56C are provided in the place where the distance A1 is set, the slits 58C are provided in the place where the distance A2 is set, the slits 60C are provided in the place where the distance A3 is set, the slits 62C are provided in the place where the distance A4 is set, the slits 50C are provided in the place where the distance A5 is set, the slits 52C are provided in the place where the distance A6 is set, and the slits 54C are provided in the place where the distance A7 is set.

The slits 50C, the slits 52C, the slits 54C, the slits 56C, the slits 58C, the slits 60C, and the slits 62C are each a pair of slits formed only in the vicinities of the lead terminals.

On the other hand, the above slits are not provided between portions that become the terminals arranged in the B1 area and the B2 area of FIG. 1, to which a high voltage is not applied and between which a spatial distance and a creepage distance that are certain distances or more are not required.

Figure 16:
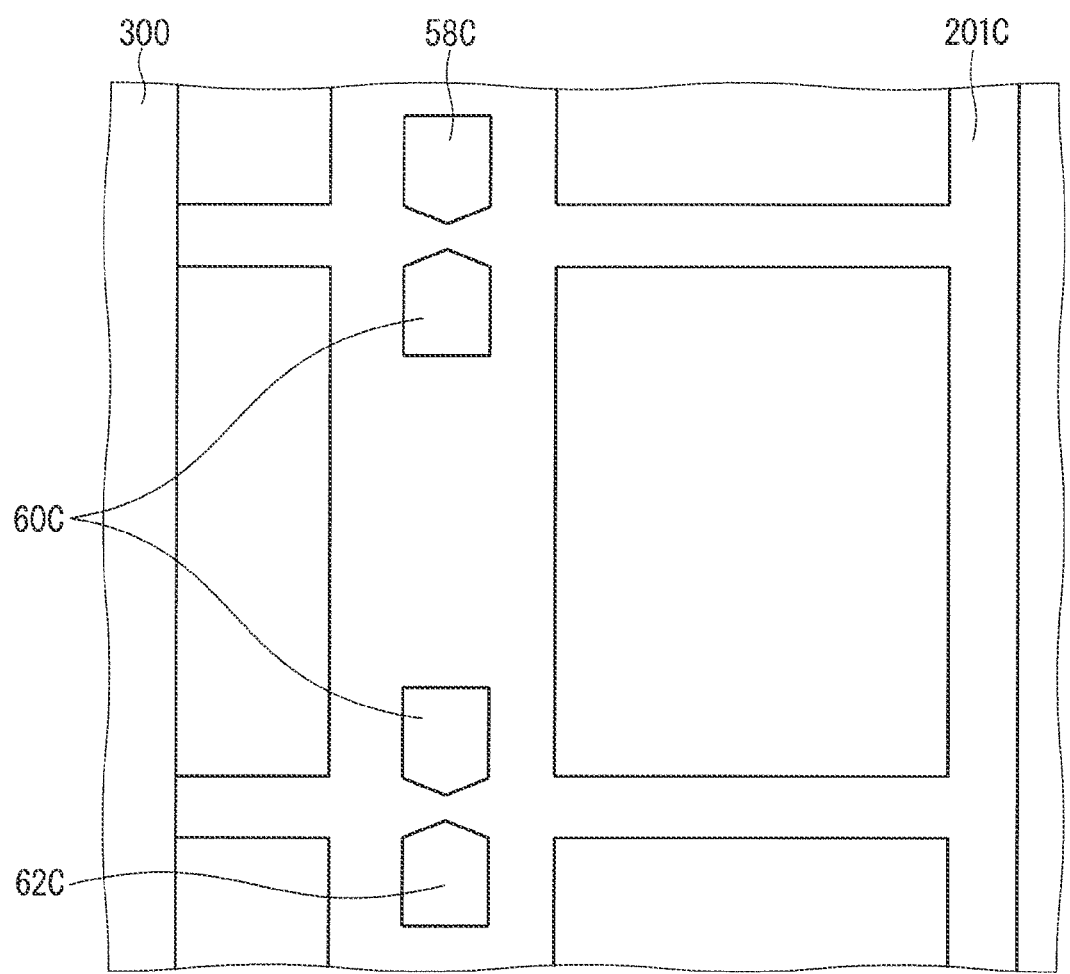
FIG. 16 is a plan view showing an example of the shape of the slit shown in FIG. 15.

FIG. 16 is a plan view showing an example of the shape of the slit 60C shown in FIG. 15. An example is shown in FIG. 16, the slit 60C has a shape in which the surface facing the lead terminal has a convex shape (a shape having a vertex in FIG. 16). The shapes of the other slits may be the same.

According to the configuration of the present preferred embodiment, a slit is formed only in the vicinity of the lead terminal, so that a bending position is stabilized when the lead terminal is processed in the later lead forming step. Therefore, a dimensional variation in the lead terminal can be suppressed. Further, the area where the slit is formed becomes narrow, so that the mechanical strength of the lead frame can be improved.

Further, the shape of the surface, facing the lead terminal, of the slit is convex, a bending position is stabilized when the lead terminal is processed in the later lead forming step. Therefore, a dimensional variation in the lead terminal can be suppressed.

Fifth Preferred Embodiment

A manufacturing method of a semiconductor device and the semiconductor device, according to the present preferred embodiment, will be described. In the following description, the same constituents as those described in the above preferred embodiment are designated by the same reference numerals and illustrated, and the detailed description thereof will be appropriately omitted.

<Manufacturing Method of Semiconductor Device>

Figure 18:
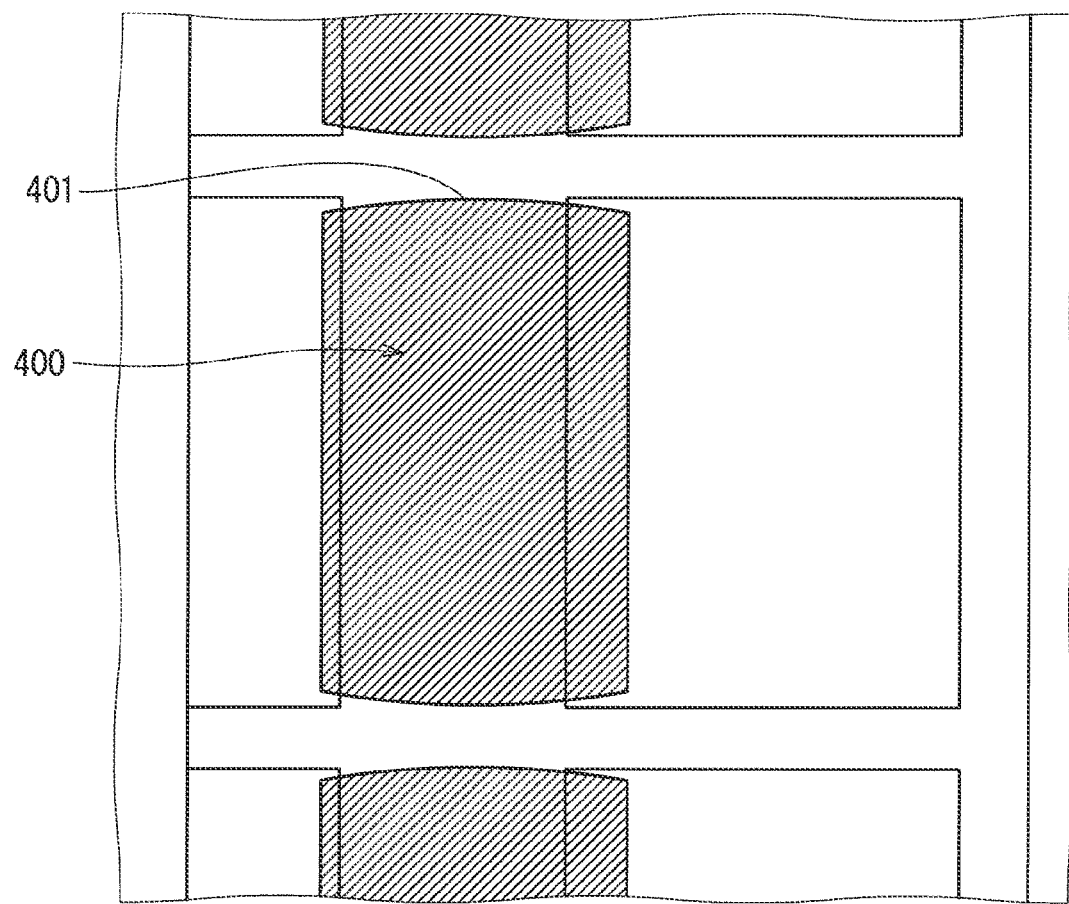
FIG. 18 is a plan view showing an example of the shape of a cut component shown in FIG. 17.

FIG. 17 is a plan view showing an example of the structure of the semiconductor device, according to the present preferred embodiment, at the time when steps from the power chip die bonding step to the transfer molding step have been completed. FIG. 18 is a plan view showing an example of the shape of a cut component 400 shown in FIG. 17.

For the distances A1 to A7 in FIG. 1 each requiring a spatial distance and a creepage distance that are certain distances or more, an end face 401 of the cut component 400 for performing tie bar cut on a lead 201D has a convex shape (a circular shape in FIG. 18), as an example is shown in FIGS. 17 and 18. The shapes of the end faces 401 of other portions of the cut component 400 may be the same.

Figure 19:
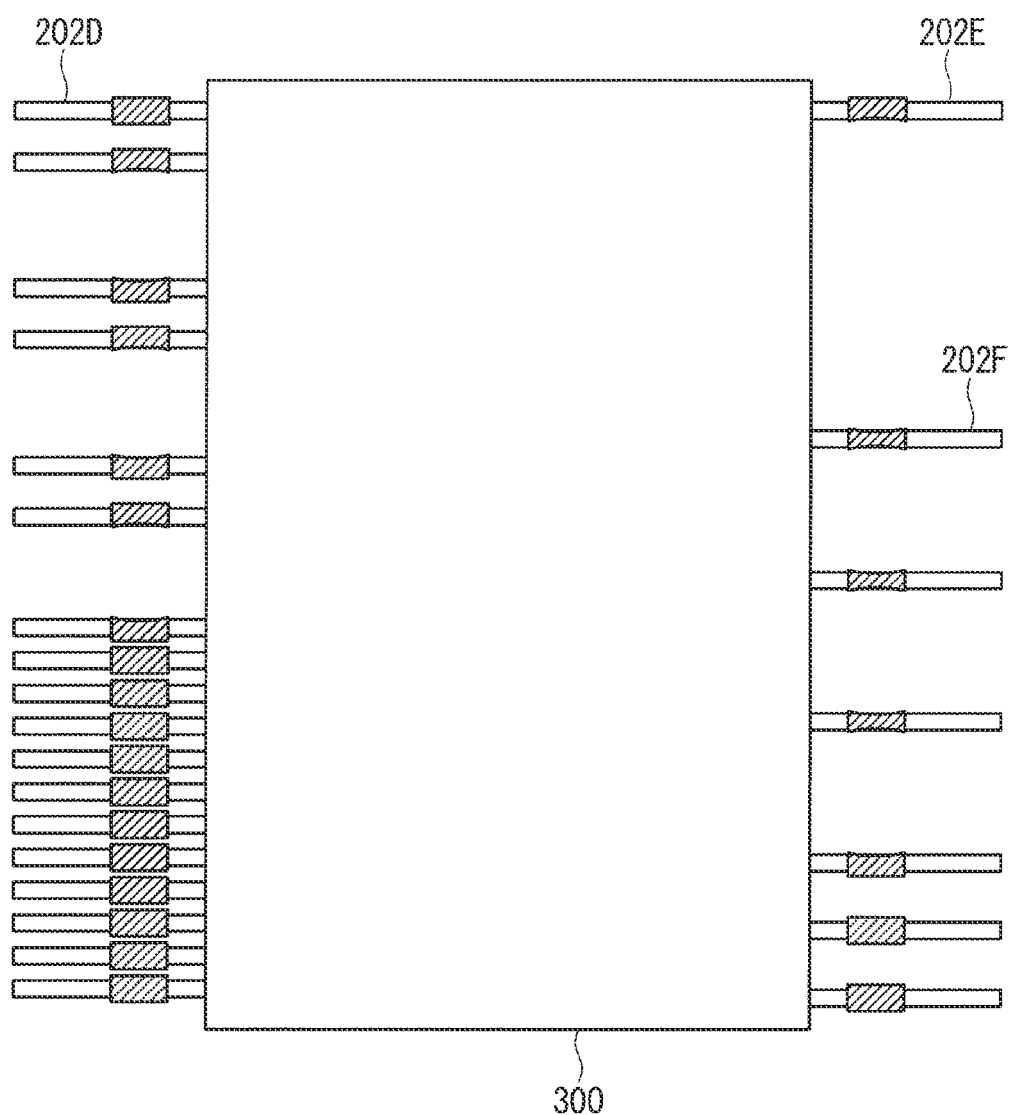
FIG. 19 is a plan view showing an example of the structure of the semiconductor device at the time when, after the transfer molding step in FIG. 5, the tie bar cutting step and up to the lead cutting step have been completed.

FIG. 19 is a plan view showing an example of the structure of the semiconductor device at the time when, after the transfer molding step in FIG. 5, the tie bar cutting step and up to the lead cutting step have been completed.

As an example is shown in FIG. 19, a lead terminal 202D, a lead terminal 202E, and a lead terminal 202F connected to the respective lead frames extend from the mold resin 300, respectively.

Here, the lead terminal 202D is a lead terminal in which the end faces of the cut components 400 used on both sides of a place where the terminal is formed have no convex shape. The lead terminal 202E is a lead terminal in which an end face 401 of the cut component 400 used on one side of a place where the terminal is formed has a convex shape. The lead terminal 202F is a lead terminal in which the end faces 401 of the cut component 400 used on both sides of a place where the terminal is formed has a convex shape.

In the lead terminal 202E and the lead terminal 202F, the thickness of each lead terminal is reduced on the side where the end face 401 of the cut component 400 used has a convex shape. That is, the end face 401 of the cut component 400 at the corresponding position is formed to narrow the area where the lead terminal is formed.

According to the configuration of the present preferred embodiment, only by changing the shape of the cut component 400 used in the tie bar cutting step without changing the shape of the existing lead frame, the spatial distance and creepage distance between the lead terminals, in the place corresponding to the above end face 401, can be prevented from being decreased even after the lead forming step. On the other hand, the thickness of each lead terminal is maintained between the lead terminals to which a high voltage is not applied, so that the electrical stability and mechanical strength of the lead frame can be improved.

Effects Obtained by Preferred Embodiments Described Above

Next, examples of the effects obtained by the preferred embodiments described above will be shown. In the following description, the effects will be described based on the specific configurations whose examples have been shown in the above preferred embodiments. However, the configurations may be replaced with other specific configurations whose examples are shown in the present specification within a range in which similar effects can be obtained.

In addition, the replacement may be performed across a plurality of preferred embodiments. That is, the same effects may be obtained by combining the respective configurations whose examples have been shown in different preferred embodiments.

According to the preferred embodiments described above, at least one semiconductor element is provided in the manufacturing method of a semiconductor device. Here, the semiconductor element corresponds to, for example, a pair of the high-voltage IC 18 and the low-voltage IC 20, and the like. Then, a plurality of first terminals, and at least one second terminal that is a control terminal to which a voltage lower than that of the first terminal is applied, are connected to the semiconductor element. Here, the first terminal corresponds to, for example, any one of the lead terminal 202B, the lead terminal 202C, and the like (hereinafter, it may be described, for convenience, such that any one of them is made to correspond). The second terminal corresponds to, for example, the lead terminal 202A and the like. Then, a first bent part is formed in the first terminal. Here, the first bent part corresponds to, for example, a portion that has bulged when the processed part 203 is bent, and the like. On each of the surfaces, facing each other, of the plurality of first terminals that are adjacent to each other (e.g., the surfaces, facing each other and defining the distance E, of the lead terminal 202B and the lead terminal 202C in FIG. 11), the first bent part, which has bulged when the processed part 203 is bent, does not protrude.

According to such a configuration, the bent part does not protrude on each of the surfaces, facing each other, of the terminals to which a high voltage is applied, so that the spatial distance and creepage distance between the lead terminals are not decreased as shown in, for example, FIG. 11 and the like. Therefore, the spatial distance and creepage distance between the terminals are ensured, and an increase in size of the semiconductor device can be suppressed. Further, since the processed part 203 is thinner than the other portions of the lead terminal, a bending position is stabilized when the lead terminal is processed in the later lead forming step. Therefore, a dimensional variation in the lead terminal can be suppressed.

When other configurations whose examples are shown in the present specification are appropriately added to the above configurations, that is, even when other configurations in the present specification, which have not been mentioned as the above configurations, are appropriately added, the same effects can be obtained.

In addition, if there are no particular restrictions, the order in which the respective processing are performed can be changed.

In addition, according to the preferred embodiments described above, a plurality of the lead terminals 202A are connected to the semiconductor element. Then, the second bent part is formed in each lead terminal 202A. On the surfaces, facing each other, of the plurality of lead terminals 202A that are adjacent to each other (e.g., the surfaces, facing each other and defining the distance D, of the lead terminal 202B and the lead terminal 202A in FIG. 11), the second bent part protrudes. According to such a configuration, the thickness of the lead terminal (control terminal) to which a high voltage is not applied is maintained, so that the electrical stability and mechanical strength of the lead frame can be improved.

Further, according to the preferred embodiments described above, connecting, to the semiconductor element, a plurality of first terminals and the lead terminal 202A means that the lead 201 (or the lead 201A, the lead 201B, the lead 201C, the lead 201D) is connected to the semiconductor element, and a tie bar part, which is an area between places that become the first terminals or the lead terminals 202A, of the lead 201 is cut. Then, the slit 56 and the like are formed in the tie bar part corresponding to the area between the plurality of first terminals that are adjacent to each other. According to such a configuration, the tie bar cutting step and the lead cutting step are performed in a state where a slit is formed between the lead terminals to which a high voltage is applied. Thereby, in the place where the slit is formed, the spatial distance and creepage distance between the lead terminals are not decreased, as show in, for example, FIG. 11 and the like, even after the lead forming step. Therefore, the size of the semiconductor device can be reduced. Further, since the cutting amount of the tie bar part is reduced in the place where the slit is formed, a load to be applied to the cut component (mold) is reduced. Therefore, an amount of wear of the mold can be reduced.

According to the preferred embodiments described above, the surfaces, facing the plurality of first terminals that are adjacent to each other, of the slit 56A and the like have a convex shape. According to such a configuration, a bending position is stabilized when the lead terminal is processed in the later lead forming step. Therefore, a dimensional variation in the lead terminal can be suppressed.

In addition, according to the preferred embodiments described above, the slits 56B (or slits 56C) are formed only in the vicinities of the plurality of first terminals that are adjacent to each other. According to such a configuration, the area where the slit is formed is narrowed, so that the mechanical strength of the lead frame can be improved.

In addition, according to the preferred embodiments described above, connecting, to the semiconductor element, the plurality of first terminals and the lead terminal 202A means that the lead 201D is connected to the semiconductor element, and a tie bar part, which is an area between places that become the first terminals or the lead terminals 202A, of the lead 201D is cut. The cut component 400 for cutting the tie bar part has the end face 401 having a convex shape, corresponding to the area between the plurality of first terminals that are adjacent to each other. According to such a configuration, only by changing the shape of the cut component 400 used in the tie bar cutting step without changing the shape of the existing lead frame, the spatial distance and creepage distance between the lead terminals can be prevented from being decreased in the place corresponding to the end face 401 even after the lead forming process.

According to the preferred embodiments described above, the semiconductor device includes at least one semiconductor element and a plurality of terminals connected to the semiconductor element. Here, the plurality of terminals include a plurality of first terminals each having a first bent part, and at least one lead terminal 202A that is a control terminal to which a voltage lower than that of the first terminal is applied. On the surfaces, facing each other, of the plurality of first terminals that are adjacent to each other, the first bent part does not protrude.

According to such a configuration, the bent part does not protrude on each of the surfaces, facing each other, of the terminals to which a high voltage is applied, so that the spatial distance and creepage distance between the lead terminals are not decreased as shown in, for example, FIG. 11 and the like. Therefore, the spatial distance and creepage distance between the terminals are ensured, and an increase in size of the semiconductor device can be suppressed. Further, since the processed part 203 is thinner than the other portions of the lead terminal, a bending position is stabilized when the lead terminal is processed in the later lead forming step. Therefore, a dimensional variation in the lead terminal can be suppressed.

Furthermore, even when other configurations whose examples are shown in the present specification are appropriately added to the above configurations, that is, even when other configurations in the present specification, which have not been mentioned as the above configurations, are appropriately added, the same effects can be obtained.

According to the preferred embodiments described above, the semiconductor device includes a plurality of the lead terminals 202A. Each lead terminal 202A has a second bent part. On the surfaces, facing each other, of the plurality of the lead terminals 202A that are adjacent to each other, the second bent part protrudes. According to such a configuration, the thickness of the lead terminal (control terminal) to which a high voltage is not applied is maintained, so that the electrical stability and mechanical strength of the lead frame can be improved.

According to the preferred embodiments described above, a wide-bandgap semiconductor is used as the semiconductor element. A switching element or diode element using a wide-bandgap semiconductor has a high voltage resistance and a high allowable current density. Therefore, a switching element or a diode element can be miniaturized by using a wide-bandgap semiconductor. Further, by using these miniaturized switching elements or diode elements, a semiconductor device incorporating these elements can be miniaturized. Furthermore, the switching element or diode element using a wide-bandgap semiconductor has a high heat resistance, so that the heat dissipation fins of a heat sink can be miniaturized. Still furthermore, the switching element or diode element using a wide-bandgap semiconductor has a low power loss, so that the efficiency of the switching element or diode element can be improved, and further the efficiency of the semiconductor device can be improved. It is desirable that wide-bandgap semiconductors are used in both a switching element and a diode element, but a wide-bandgap semiconductor may be used in either element.

Modified Examples of Preferred Embodiments Described Above

In the preferred embodiments described above, the quality of material, material, size, shape, relative arrangement relationship, conditions of implementation, and the like of each constituent may also be described, but each of them is one example in all aspects and not restrictive.

Thus, countless modified examples and equivalents, the examples of which have not been shown, can be conceived of within the scope of the technology disclosed in the present specification. For example, a case where at least one constituent is modified, added, or omitted, and further a case where at least one constituent in at least one preferred embodiment is extracted to combine with constituents in the other preferred embodiments, shall be included.

In addition, in the preferred embodiments described above, when the name and the like of a material are described without being particularly specified, for example, an alloy or the like in which other additives are contained in the material shall be included as long as there is no contradiction.

In addition, when it is described in the preferred embodiments described above that "one" constituent is provided, "one or more" of the constituents may be provided as long as there is no contradiction.

Further, each constituent in the preferred embodiments described above is a conceptual unit, and the scope of the technology disclosed in the present specification includes: a case where one constituent is made of a plurality of structures; a case where one constituent corresponds to a part of a structure; and a case where a plurality of constituents are provided in one structure.

In addition, each constituent in the preferred embodiments described above includes structures having different structures or shapes as long as the same function is exerted.

In addition, the description in the present specification is referred to for all purposes related to the present technology, and none of the description is recognized as a conventional technology.

While the disclosure has been shown and described in detail, the foregoing description is in all aspects illustrative and not restrictive. It is therefore understood that numerous modifications and variations can be devised.

What is claimed is:

1. A manufacturing method of a semiconductor device, the method comprising:
   providing at least one semiconductor element;
   connecting, to the semiconductor element, a plurality of first terminals and at least one second terminal that is a control terminal to which a voltage lower than that of the first terminal is applied; and
   forming a first bent part between a first portion and a second portion of the first terminal,
   wherein on surfaces, facing each other, of the plurality of first terminals that are adjacent to each other, the first bent part does not protrude.

2. The manufacturing method of a semiconductor device according to claim 1, wherein
   a plurality of the second terminals are connected to the semiconductor element,
   a second bent part is formed in each of the second terminals,
   on surfaces, facing each other, of the plurality of the second terminals that are adjacent to each other, the second bent part protrudes, and
   the second bent part is thicker than the first bent part.

3. The manufacturing method of a semiconductor device according to claim 1, wherein
   connecting, to the semiconductor element, the plurality of first terminals and the second terminal means that a lead is connected to the semiconductor element and a tie bar part, which is an area between places that become the first terminals or the second terminals, before the lead is cut, and
   a slit is formed in the tie bar part corresponding to an area between the plurality of first terminals that are adjacent to each other.

4. The manufacturing method of a semiconductor device according to claim 3, wherein surfaces, facing the plurality of first terminals that are adjacent to each other, of the slit have a convex shape.

5. The manufacturing method of a semiconductor device according to claim 3, wherein the slits are formed only in vicinities of the plurality of first terminals that are adjacent to each other.

6. The manufacturing method of a semiconductor device according to claim 1, wherein
   connecting, to the semiconductor element, the plurality of first terminals and the second terminal means that a lead is connected to the semiconductor element and a tie bar part, which is an area between places that become the first terminals or the second terminals, before the lead is cut, and
   a cut component for cutting the tie bar part has an end face having a convex shape, corresponding to an area between the plurality of first terminals that are adjacent to each other.

7. A semiconductor device comprising:
   at least one semiconductor element; and
   a plurality of terminals connected to the semiconductor element,
   wherein the plurality of terminals include
   a plurality of first terminals having a first bent part, each first terminal of the plurality of first terminals including a first portion and a second portion, wherein the first bent part is between the first portion and the second portion, and
   at least one second terminal that is a control terminal to which a voltage lower than that of the first terminal is applied, and
   on surfaces, facing each other, of the plurality of first terminals that are adjacent to each other, the first bent part does not protrude.

8. The semiconductor device according to claim 7, comprising a plurality of the second terminals,
   wherein each of the second terminals has a second bent part,
   on surfaces, facing each other, of the plurality of the second terminals that are adjacent to each other, the second bent part protrudes, and
   the second bent part is thicker than the first bent part.

9. The semiconductor device according to claim 7, wherein a wide-bandgap semiconductor is used for the semiconductor element.

10. The manufacturing method of a semiconductor device according to claim 2, wherein
    connecting, to the semiconductor element, the plurality of first terminals and the second terminal means that a lead is connected to the semiconductor element and a tie bar part, which is an area between places that become the first terminals or the second terminals, before the lead is cut, and
    a slit is formed in the tie bar part corresponding to an area between the plurality of first terminals that are adjacent to each other.

11. The manufacturing method of a semiconductor device according to claim 4, wherein the slit is formed only in vicinities of the plurality of first terminals that are adjacent to each other.

12. The manufacturing method of a semiconductor device according to claim 2, wherein
    connecting, to the semiconductor element, the plurality of first terminals and the second terminal means that a lead is connected to the semiconductor element and a tie bar part, which is an area between places that become the first terminals or the second terminals, before the lead is cut, and
    a cut component for cutting the tie bar part has an end face having a convex shape, corresponding to an area between the plurality of first terminals that are adjacent to each other.

13. The manufacturing method of a semiconductor device according to claim 3, wherein
    connecting, to the semiconductor element, the plurality of first terminals and the second terminal means that a lead is connected to the semiconductor element and a tie bar part, which is an area between places that become the first terminals or the second terminals, before the lead is cut, and a cut component for cutting the tie bar part has an end face having a convex shape, corresponding to an area between the plurality of first terminals that are adjacent to each other.

14. The semiconductor device according to claim 8, wherein a wide-bandgap semiconductor is used for the semiconductor element.

15. The manufacturing method of a semiconductor device according to claim 1, wherein the plurality of the first terminals are spaced at a distance from each other during the connecting of the plurality of the first terminals to the semiconductor device, and the plurality of the first terminals remain spaced at the distance from each other after the forming of the first bent part.

16. The semiconductor device according to claim 7, wherein the plurality of the first terminals are spaced at a distance from each other at locations of each first terminal of the plurality of the first terminals on each side of the first bent part, and the first bent part does not protrude toward an adjacent first terminal of the plurality of the first terminals, such that the distance between adjacent first terminals of the plurality of the first terminals on each side of the first bent part is the distance.

17. The manufacturing method of a semiconductor device according to claim 1, wherein the first bent part being thinner than other portions of the first terminal.

18. The semiconductor device according to claim 7, wherein the first bent part being thinner than other portions of the first terminal.

19. The manufacturing method of a semiconductor device according to claim 1, wherein the first bent part includes at least one recess from a respective facing surface.

20. The semiconductor device according to claim 7, wherein the first bent part includes at least one recess from a respective facing surface.

* * * * *